United States Patent [19]

Nishikura et al.

[11] Patent Number: 5,408,376
[45] Date of Patent: Apr. 18, 1995

[54] PIEZOELECTRIC HEAD ACTUATOR

[75] Inventors: Takahiro Nishikura, Ikoma; Katsumi Imada, Osaka; Takashi Nojima, Katano; Katsu Takeda, Osaka; Masanori Sumihara, Higashiosaka; Osamu Kawasaki, Tsuzuki, all of Japan

[73] Assignee: Matsushita Electric Industrial Co., Ltd., Osaka, Japan

[21] Appl. No.: 130,711

[22] Filed: Oct. 4, 1993

[30] Foreign Application Priority Data

Oct. 6, 1992 [JP] Japan ................ 4-266933

[51] Int. Cl.⁶ ................ G11B 5/584; G11B 5/592
[52] U.S. Cl. ................................................ 360/109
[58] Field of Search ............... 360/109, 77.16, 77.17

[56] References Cited

U.S. PATENT DOCUMENTS

| 4,099,211 | 7/1978 | Hathaway | 360/109 |
| 4,251,838 | 2/1981 | Saito | 360/109 |
| 4,326,228 | 4/1982 | Sakamoto | 360/109 |
| 4,438,469 | 3/1984 | Ohba | 360/109 |
| 4,558,381 | 12/1985 | Bermans | 360/77 |
| 4,647,999 | 3/1987 | Mlinaric et al. | 360/109 |
| 4,805,057 | 2/1989 | Ogawa et al. | 360/109 |
| 5,036,419 | 7/1991 | Okauchi et al. | 360/109 |
| 5,103,361 | 4/1992 | Nagatsuka et al. | 360/109 |

FOREIGN PATENT DOCUMENTS 55-139630 10/1980 Japan .
57-60528 4/1982 Japan .

Primary Examiner—Robert S. Tupper
Attorney, Agent, or Firm—Sandler Greenblum & Bernstein

[57] ABSTRACT

A bimorph element is formed by bonding first and second piezoelectric bodies together with an elastic shim interposed between. The bimorph element is firmly held by a base frame which has a recess and a groove at the bottom of the recess. The elastic shim 103 has an extending portion which is firmly inserted in the groove and its end portion is inserted in the recess of the base frame. A space between the recess and the end portion of the bimorph element is filled by an elastic support member.

22 Claims, 16 Drawing Sheets

PIEZOELECTRIC HEAD ACTUATOR

BACKGROUND OF THE INVENTION

1. Field of the Invention

The present invention relates to a bimorph type piezoelectric head actuator comprising piezoelectric bodies and an elastic shim material for use as a head actuator for automatic tracking in a video cassette recorder (VCR), for example.

2. Description of the Prior Art

Demand for high performance head actuators for faithfully recording and reproducing video signals to a magnetic tape medium has grown in conjunction with the trends toward high functionality and image quality in VCRs and other video recording and reproducing apparatuses.

A conventional magnetic head apparatus of this type is described below with reference to the figures.

FIG. 14a is a partially cut-away perspective view of the conventional magnetic head apparatus according to Japanese patent laid-open Publication No. 55-139630 wherein the head actuator 500 is provided on a head drum 501.

In the flying head helical scan VCR in which the head actuator shown in FIG. 14a is applied, the magnetic tape 502 is wound around the head drum 501 at a predetermined angle, and recording tracks T (solid lines, FIG. 14b) are formed on the magnetic tape 502 at an angle corresponding to the tape speed and the velocity of the flying heads. When playing back the magnetic signal from the magnetic tape at a playback speed differing from the recording speed, as during still, slow motion, high speed, or reverse playback, the scanning path of the magnetic heads differs from the recording track. As a result, the magnetic heads scan a path offset from the recording tracks as shown by the dotted line in FIG. 14b, resulting in guard band noise, crosstalk, and other problems.

Flying head VCRs of this type therefore feature a tracking head actuator 500 enabling the magnetic heads to accurately trace the recording tracks in each of the variable speed playback modes. A typical head actuator uses a bimorph plate as shown in FIG. 15.

The structure and operating principle of this head actuator is described below with reference to FIG. 15. This bimorph plate 601 is mounted on the head base 602 and comprises two piezoelectric ceramic bodies 603a and 603b sandwiching a metal reinforcing plate 604 that also functions as a middle electrode.

The bimorph plate 601 comprising the head actuator is a cantilever structure as shown in FIG. 15 supported on just one end by the head base 602 or other solid member with the other end connected to the magnetic head 605. This bimorph plate 601 is manufactured by laminating the two piezoelectric ceramic bodies 603a and 603b through the metal reinforcing plate 604 in the fixed-end side 601B of the bimorph plate 601, and directly bonding the two piezoelectric ceramic bodies 603a and 603b together with an adhesive on the magnetic head 605 side 601A.

With the bimorph plate 601 thus constructed, the bimorph plate 601 is flexibly displaced in direction C (FIG. 15) by the electric field generated by a voltage applied between the electrodes 606 and 607 on the outside surface of the piezoelectric ceramic bodies of the part 601B including the metal reinforcing plate 604, and drives part 601A to displace in the same direction by the electric field generated by a voltage applied between the electrodes 608 and 609 provided on the piezoelectric ceramic bodies.

The bimorph plate 601 is thus flexibly displaced by the electrodes 606 and 607 to change the position of the magnetic head 605 relative to the magnetic tape 610, and the bimorph plate 601 is extended in the direction of the magnetic tape 610 by electrodes 608 and 609 to maintain a constant gap between the magnetic tape 610 and magnetic head 605 (specifically, a constant projection of the magnetic head 605) and prevent a loss of the recording/playback signal due to magnetic head 605 tracking by stabilizing the head-tape contact pressure.

The problem of recording/playback signal deterioration caused by the relative angle of the magnetic head 605 to the magnetic tape 610 is not, however, resolved.

The head actuator shown in Japanese patent application number 57-60528 was proposed to resolve this problem. This head actuator is described below with reference to FIG. 16.

This head actuator comprises first, second, third, and fourth bimorph plates 701, 702, 704 and 705, two electro-mechanical conversion elements 703 and 706, a head support 707, and a magnetic head 708. In the first electro-mechanical conversion element 703, the first bimorph plates 701 are sandwiched between the two second bimorph plates 702 at the fixed end; in the second electro-mechanical conversion element 706, the third bimorph plates 704 are sandwiched between the two fourth bimorph plates 705 at the fixed end. The head support 707 has a U-shaped cross section connecting the free ends of the first and second electro-mechanical conversion element. The magnetic head 708 is attached to the head support 707.

In this head actuator, an electric field is applied to the piezoelectric ceramic bodies of the first to fourth bimorph plates to expand the piezoelectric ceramic bodies on side Sa and contract them on side Sb. To displace the actuator in the opposite directions, the applied electric fields are reversed. The first and second electro-mechanical conversion elements can thus be displaced in the directions of arrow C in FIG. 16 by controlling the direction of the applied electric field.

In general, the relationship between the displacement $\xi$ (equation (1)) of the DC field and the resonance frequency f (equation (2)) of the bimorph plates in a one dimensional model in which a metal reinforcing plate ("elastic shim" hereinafter) is sandwiched between piezoelectric bodies can be expressed by equations (1) and (2) below.

$$\xi = \frac{3d_{31}S_0}{4S_{11}} \times \frac{D^2}{t^2} \left(1 + \frac{t_1}{t}\right) \quad (1)$$

$$f = \frac{1}{2\pi} \times (1.875)^2 \times \frac{t}{D^2} \times (12\rho_0 S_0)^{-\frac{1}{2}} \quad (2)$$

wherein $$\rho_0 = \left[\rho_1 \frac{t_1}{t} + \rho\left(1 - \frac{t_1}{t}\right)\right]$$

and $$\frac{1}{S_0} = \frac{1}{S_1}\left(\frac{t_1}{t}\right)^3 + \frac{1}{S_{11}(1 - k_{31}^2)}\left(1 - \right.$$

-continued $$\left(\frac{t_1}{t}\right)^3\right\}\left[1 - \frac{3}{4} k_{31}^2 \cdot \frac{1 + 2\left(\frac{t_1}{t}\right) + \left(\frac{t_1}{t}\right)}{1 + \left(\frac{t_1}{t}\right) + \left(\frac{t_1}{t}\right)^2}\right]$$

where $d_{31}$ is the piezoelectric constant, D is the piezoelectric body length, t is the piezoelectric body thickness, $t_1$ is the elastic shim thickness, $\rho$ is the density of the piezoelectric body, $\rho_1$ is the density of the elastic shim, $S_{11}$ is the elastic modulus of the piezoelectric body, $S_1$ is the elastic modulus of the elastic shim, and $k_{31}$ is the coupling factor. From equations (1) and (2) above we know that the resonance frequency and displacement are inversely related as increasing one decreases the other.

In the head actuator shown in FIG. 16, however, the displacement obtained by the first and third bimorph plates 701 and 704 is increased by the second and fourth bimorph plates 702 and 705, and greater displacement can be achieved without lowering the resonance frequency of the electromechanical conversion element.

Furthermore, the spacing angle between the magnetic head 708 and magnetic tape 709 can be set to essentially zero, and deterioration of the recording/playback signal can be greatly improved, because the magnetic head 708 can be moved parallel to the magnetic tape 709 by means of the head support 707 connecting the first and second electro-mechanical conversion elements.

The problem with this conventional head actuator, however, is that it is not possible to simultaneously improve the displacement and resonance frequency.

In addition, because the piezoelectric bodies forming the bimorph element are fastened directly to the base or mounting frame, stress is concentrated in the fixed part of the piezoelectric bodies when the bimorph elements are driven, resulting in deteriorated performance due to cracking and other factors.

In addition, the position of the magnetic head relative to the magnetic tape changes with time because the bimorph element is deformed, irrespective of the applied strain, due to plastic deformation of the fixed end of the piezoelectric ceramic caused by the weight of the bimorph element, the mass of the magnetic head, and other factors. Detecting the position of the magnetic head with a strain gauge or other device is not possible, and precise position control is difficult.

In addition, it is difficult to uniformly bond the piezoelectric ceramic to the base, and wide variations in the resonance frequency and displacement can result due the bonding state and conditions. This makes it difficult to achieve stable characteristics.

SUMMARY OF THE INVENTION

Therefore, an object of the present invention is to provide a piezoelectric actuator and head actuator for solving these problems.

To achieve this object, a piezoelectric actuator according to the present invention is a bimorph element laminating a first piezoelectric body and a second piezoelectric body with an elastic shim interposed therebetween wherein the elastic shim projects out from the first and second piezoelectric bodies at at least the fixed side of the bimorph element, and the elastic shim part projecting beyond the piezoelectric bodies is firmly secured to the base frame.

A head actuator according to the present invention comprises a piezoelectric actuator thus comprised with a magnetic head mounted on the free end thereof.

By applying this new construction wherein the piezoelectric bodies are flexibly supported on the base frame by firmly securing the elastic shim without directly securing the piezoelectric bodies to the base frame, the problem of stress concentration in the end of the piezoelectric body fixed to the base frame due to deformation of the bimorph element is eliminated.

In addition, because the elastic shim, which is a metallic material or a carbon fiber material, is firmly secured to flexibly support the piezoelectric bodies on a flexible support member, stress concentration in the fixed end of the piezoelectric body can be relieved. The position of the magnetic head mounted on the free end of the piezoelectric actuator relative to the magnetic tape can also be assured with high precision within the range of elastic shim elastic deformation because the piezoelectric bodies are also positioned by the elastic shim.

Moreover, when the bimorph elements are operated with a DC field, the effective length of the bimorph element increases and greater displacement is obtained because the length from the firmly secured part of the elastic shim determines the displacement. Furthermore, a high resonance frequency piezoelectric actuator and head actuator can be achieved because the distance from the end of the piezoelectric body fixed by the flexible support member of the bimorph element to the free end of the piezoelectric body is the effective length of the bimorph element.

By further providing a slit in the elastic shim, a high resonance frequency piezoelectric actuator and head actuator can be achieved by reducing the mass with virtually no reduction in the elastic modulus of the elastic shim.

A piezoelectric actuator and head actuator achieving both high displacement and a high resonance frequency can be achieved by securing the bimorph element with a curved fixing member because the maximum length between the fixed and free ends is determined by the displacement when a DC field is applied and the resonance frequency is determined by the shortest distance.

BRIEF DESCRIPTION OF THE DRAWINGS

The present invention will become more fully understood from the detailed description given below and the accompanying diagrams wherein.

DESCRIPTION OF PREFERRED EMBODIMENTS

First Embodiment

The first embodiment of a head actuator according to the invention is described below with reference to the cross section diagram thereof shown in FIG. 1.

Figure 1:
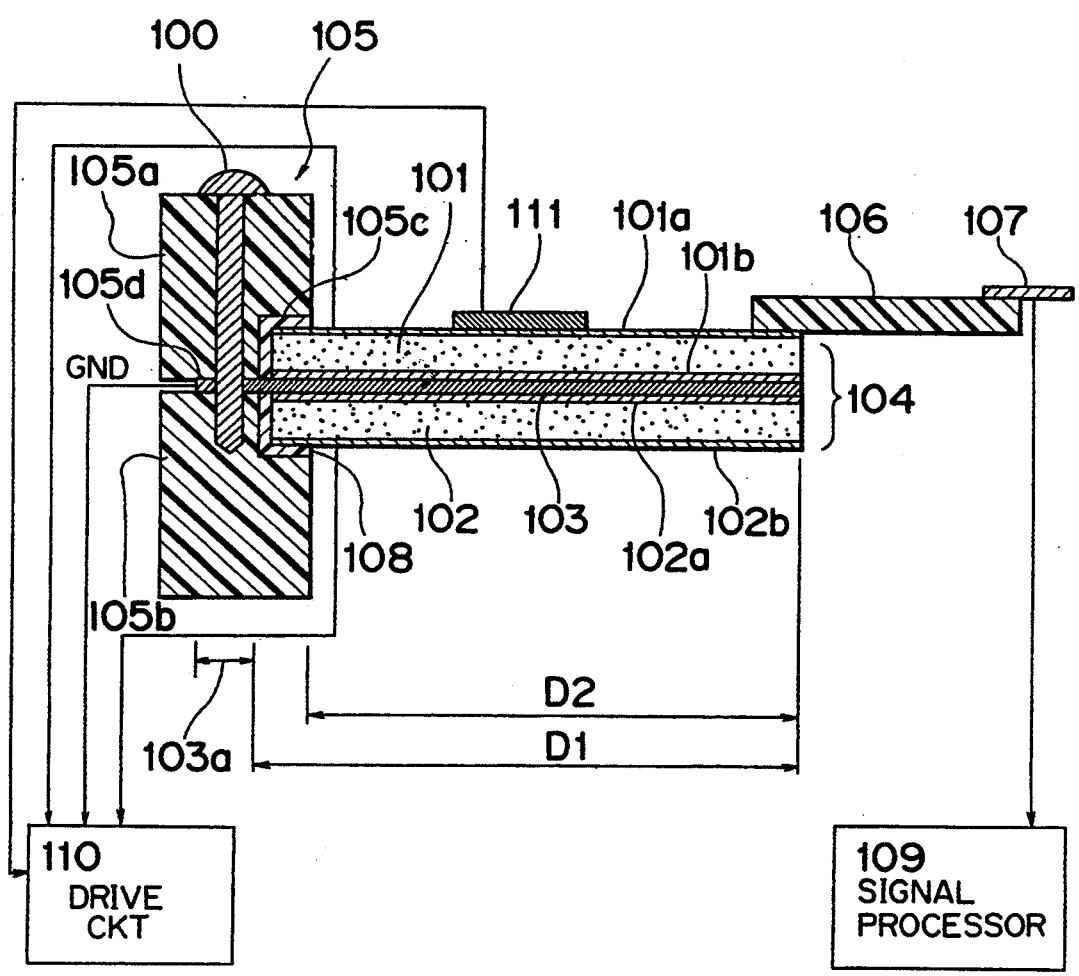
FIG. 1 is a cross sectional view of a head actuator according to the first embodiment of the present invention.

As shown in FIG. 1, this head actuator apparatus comprises a bimorph element 104, which is formed by laminating a first piezoelectric body 101 to a second piezoelectric body 102 with an elastic shim 103 interposed between the bodies 101 and 102, a base frame 105 to which the bimorph element 104 is fixed, a magnetic head support member 106 to which a magnetic head 107 is fixed, an elastic support member 108, a signal processing circuit 109, drive circuit 110, and a magnetic head position detector 111.

The first piezoelectric body 101 has opposite flat surfaces to which electrodes 101a and 101b are deposited. Similarly, the second piezoelectric body 102 has electrodes 102a and 102b. The first and second piezoelectric bodies 101 and 102 are previously polarized in their thickness direction, as shown by arrows in FIG. 2b.

The bimorph element 104 (i.e., a bimorph type piezoelectric actuator) is formed by sandwiching the elastic shim 103 between the first and second piezoelectric bodies 101, 102. The opposite surfaces of the elastic shim 103 are tightly attached to the facing bodies by a suitable adhesive. Since the length of the elastic shim 103 is longer than the piezoelectric bodies 101, 102, a portion 103a of the elastic shim 103 extends outwardly from the bodies 101 and 102 and is inserted in the base frame 105.

The elastic shim 103 is made of a material, such as phosphor bronze, elinvar, titanium or other metallic material, or a carbon fiber material, with a high elastic modulus in at least the direction parallel to the length of the bimorph element 104.

The inserted portion 103a of the elastic shim 103 is firmly held by the base frame 105 by several screws 100 (only one screw is shown in FIG. 1), or any other securing means. Preferably, the base frame 105 is formed by an upper block 105a and a lower block 105b which are also tightly fastened together as shown in FIG. 1 by the screws. The base frame 105 further has a recess 105c for receiving an end portion of the bimorph element 104. Furthermore, at the bottom of the recess 105c, a groove 105d is formed for receiving the inserted portion 103a. The size of the recess 105c is slightly greater than the size of the end portion of the bimorph element 104 so that the elastic support member 108, such as an epoxy adhesive, can be injected in a space between the recess 105c and the end portion of the bimorph element 104. Thus, by the elastic support member 108, the bimorph element 104 may not be adversely affected, such as scratched or pressured, by the edge of the recess.

According to a preferred embodiment, the thickness of the elastic shim 103 is 50 to 500 $\mu$m, the thickness of the bimorph element 104 is 150 to 1500 $\mu$m, and the thickness of the elastic support member 108 is several 10 to 1000 $\mu$m.

The magnetic head support member 106 is bonded with adhesive to the exposed surface of one of the piezoelectric bodies at the free end of the bimorph element 104, and the magnetic head 107 is fixed to the end of the magnetic head support member 106 to form the head actuator.

The strain corresponding to the displacement of the bimorph element 104 as shown in FIG. 1 is then measured with a strain gauge of position detector 111 to detect the position of the magnetic head 107. The output detection signal is input to the drive circuit 110 of the bimorph element 104 in a feedback loop to control tracking. The signal reproduced from or to be recorded to the magnetic tape by the magnetic head 107 is processed by the signal processing circuit 109 for recording/reproducing.

It is to be noted that while the elastic support member 108 in this first embodiment is an epoxy adhesive, any material with a lower elastic modulus than the piezoelectric bodies, such as hard rubber or plastic materials, can be alternatively used.

In addition, the position to which the magnetic head 107 is installed shall not be limited to that described hereinabove. The magnetic head 107 can be fixed to the bottom surface of the magnetic head support member 106. Preferably, the magnetic head 107 should be located as close as to an imaginary plane including the elastic shim 103.

Moreover, while the position detector 111 is described as a strain gauge above, it shall not be so limited and may be a means of directly detecting the displacement of the magnetic head using optical means, or any other means of detecting magnetic head displacement.

Figure 2A:
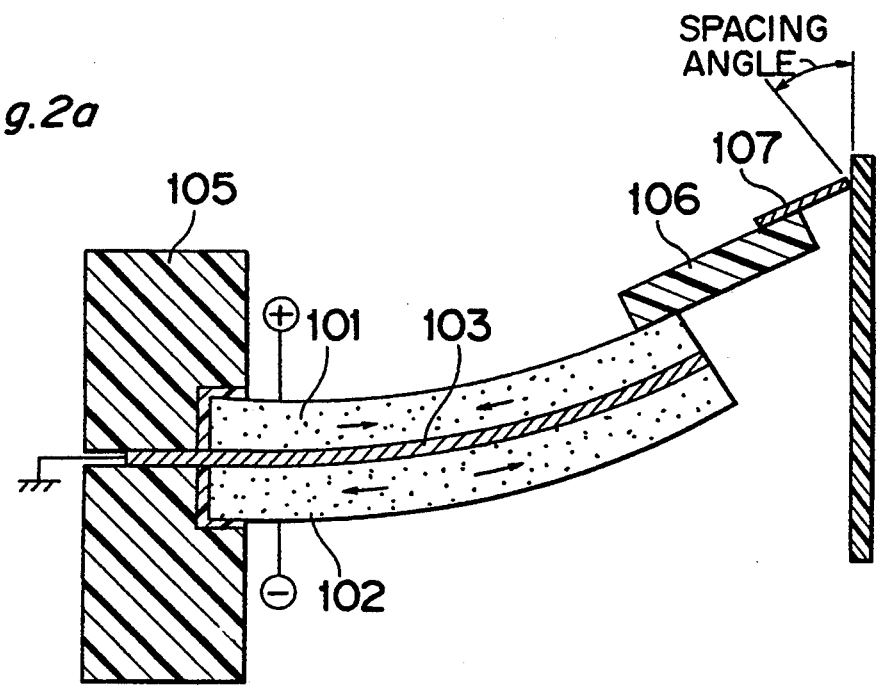
FIGS. 2a, 2b and 2c are diagrams for describing the operating principle of the first embodiment.
Figure 2B:
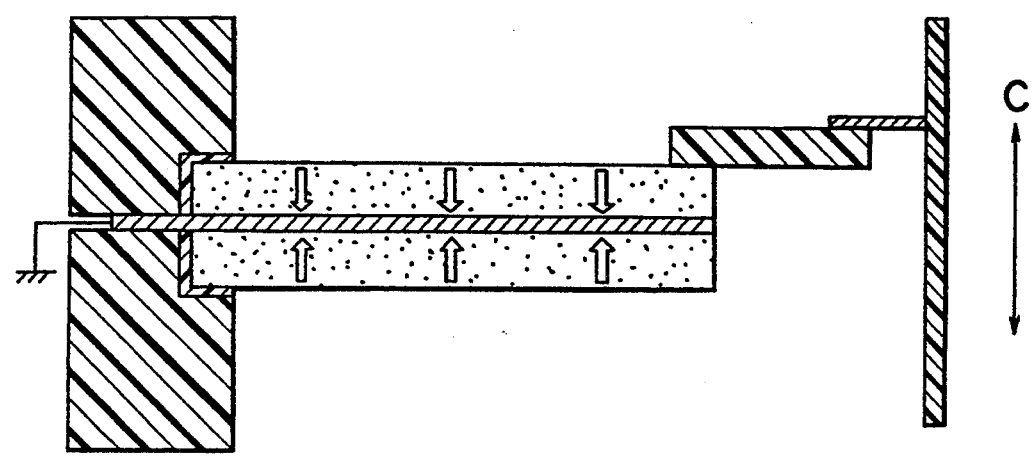
Figure 2C:
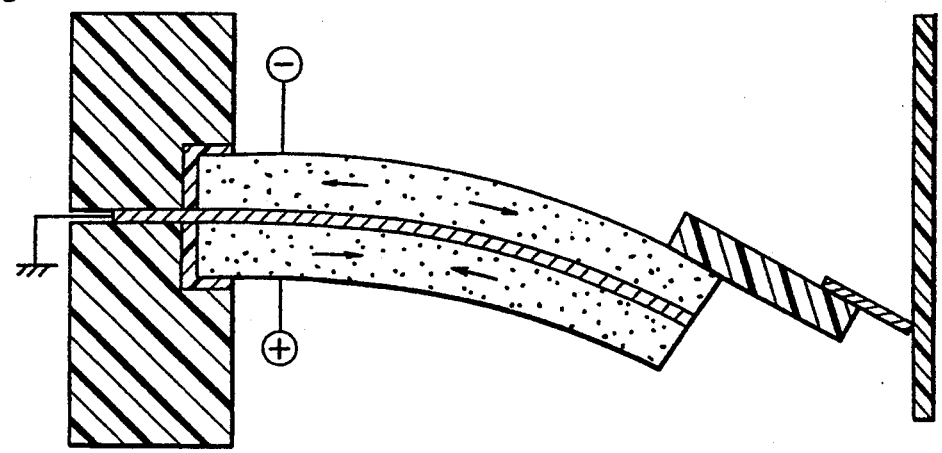

The operating principle of this head actuator is described next with reference to FIGS. 2a, 2b and 2c. As shown in FIG. 2b, the polarization of both the first and second piezoelectric bodies 101, 102 are previously made towards the elastic shim 103 as indicated by the arrows. When an electric field is applied in the direction of the axis of polarization, i.e,. plus voltage to electrode 101a and minus voltage to electrode 102b, as shown in FIG. 2a, the piezoelectric bodies stretch in the direction of the polarization axis and therefore contract in the lengthwise direction of the piezoelectric bodies, resulting in upward displacement as shown in FIG. 2a. When the electric field is applied in the opposite direction, as shown in FIG. 2c, the piezoelectric bodies are displaced in the opposite direction.

Figure 3:
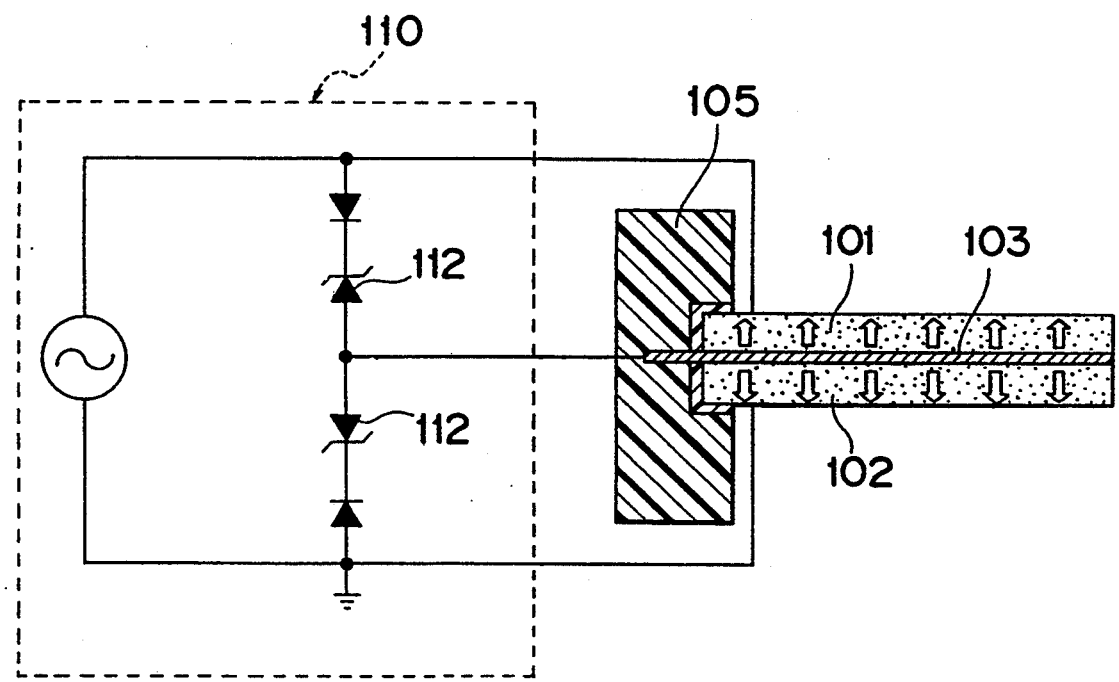
FIG. 3 is a diagram showing an example of the drive circuit for the first embodiment.

Thus, by applying an electric field between the electrodes 101a and 101b and between the electrodes 102a and 102b, the bimorph element 104 can be displaced up or down in the direction of arrow C according to the polarity of the applied electric field. However, because piezoelectric bodies have a coercive-field, the field strength at which the piezoelectric effect is lost in a piezoelectric body, the above drive method is generally not used. A drive circuit 110 for the bimorph element 104 as shown inside the dotted line portion of FIG. 3 is more commonly used in a single-side drive method applying the electric field only in the polarization direction, or diodes 112 are provided so that an electric field is applied to drive both the first and second piezoelectric bodies 101, 102 up to the limit of the anti-field strength, after which the electric field is applied to drive only one side of the bimorph element 104.

By the first embodiment, a large displacement can be obtained because flexible deformation to the stress limit of the piezoelectric bodies forming the bimorph element 104 is possible because the concentration of stress caused by deformation of the bimorph element 104 at the fixed end of the piezoelectric bodies and the base frame can be alleviated by elastically holding part of the first and second piezoelectric bodies 101, 102 of the bimorph element 104 using an adhesive or other elastic support member 108 rather than fixing the first and second piezoelectric bodies 101, 102 solidly to the base frame 105, and solidly securing the inserted portion 103a of the elastic shim 103 to the base frame 105. In addition, because cracks in the piezoelectric body due to stress concentration do not develop, reliable, high performance head actuators with minimal variation in characteristics can be achieved.

Furthermore, by eliminating the sag, which results from stress applied by the head mass and inherent weight of the piezoelectric bodies acting on the end of the piezoelectric bodies in the conventional configuration and is distinct from the strain of the bimorph element resulting from plastic deformation of the fixed end of the piezoelectric ceramic, in the bimorph element by firmly securing the fixed part 103a of the elastic shim, the position of the magnetic head to the magnetic tape can be maintained with high precision.

In addition, when the operating frequency is lower than the resonance frequency of the bimorph element, as occurs during tracking control, control of the bimorph element can be treated as a DC operation. The distance from the solidly fixed end to the free end of the bimorph element therefore becomes the effective element length $D_1$ with respect to displacement, and displacement can be increased according to equation (1). In addition, the effective element length $D_2$ with respect to the resonance frequency is the distance from the fixed end of the flexible support to the free end, and the resonance frequency can be increased. It is therefore possible to achieve a head actuator in which inversely related characteristics, specifically displacement and resonance frequency, can both be improved.

Second Embodiment

The second embodiment of a head actuator according to the invention is described below with reference to the cross section diagram thereof shown in FIG. 4a.

Figure 4A:
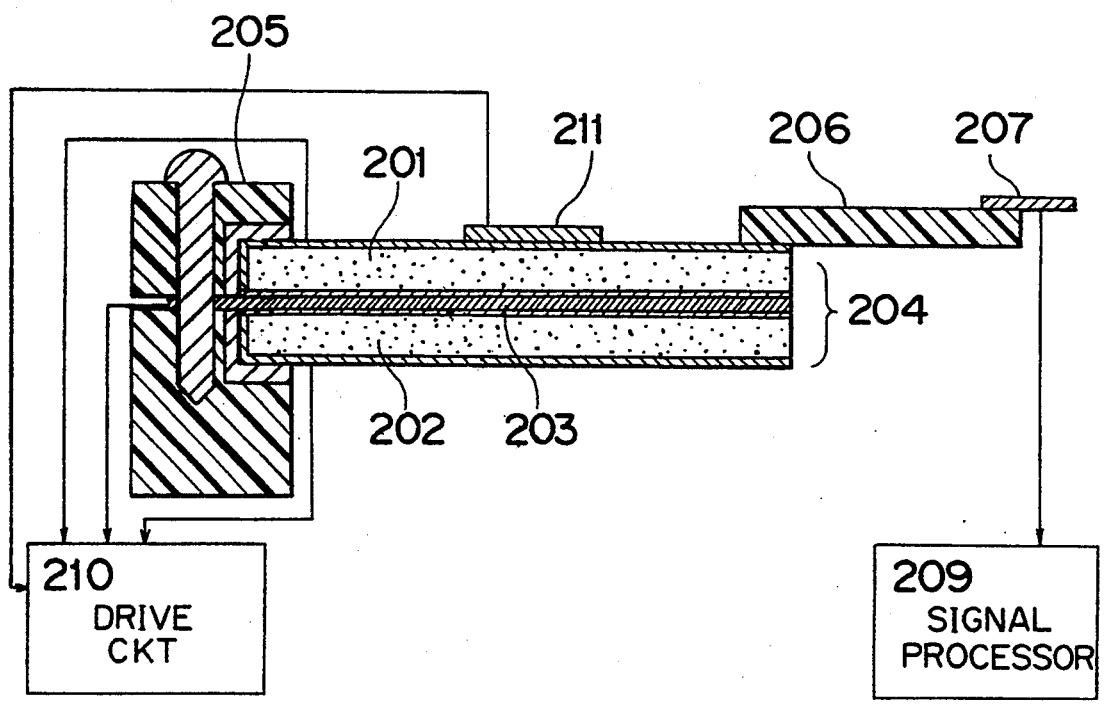
FIGS. 4a and 4b are diagrams for describing a head actuator according to the second embodiment of the present invention.
Figure 4B:
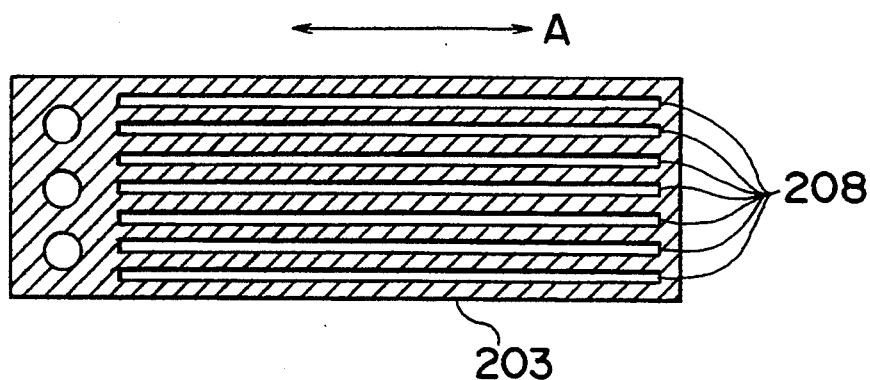

As shown in FIG. 4a, the head actuator apparatus comprises a bimorph element 204, which is formed by laminating a first piezoelectric body 201 to a second piezoelectric body 202 with an elastic shim 203, a base frame 205 to which the bimorph element 204 is fixed, a magnetic head support member 206 to which the magnetic head 207 is fixed, a signal processing circuit 209, drive circuit 210, and a magnetic head position detector 211. According to the second embodiment, as shown in FIG. 4b, the elastic shim 203 has, when viewed from a top, plural slits 208 extending ill a direction A.

In this embodiment bimorph element 204 is directly fastened to the base frame 205, but can be held in the base frame 205 in a manner similar to that described in the first embodiment as shown in FIG. 1. The magnetic head support member 206 is bonded with adhesive to the exposed surface of one of the piezoelectric bodies at the free end of the bimorph element 204, and the magnetic head 207 is fixed to the end of the magnetic head support member 206 to form the head actuator.

The operating principle of this head actuator is identical to that of the first embodiment described above.

By thus providing uniform plural slits 208 in direction A of the elastic shim 203, the mass $p_1$ of the elastic shim 203 can be reduced with virtually no change in the elastic modulus $s_1$, and the resonance frequency can be increased as shown in equation (2).

In addition, by forming the slits 208, the mechanical strength of the elastic shim 203 perpendicular to the direction A of the slits is less than the mechanical strength parallel to the direction of the slits. Deformation occurring widthwise and inhibiting deformation along the length of the bimorph element can be reduced, and displacement of the bimorph element can thus be increased.

Thus, a high performance head actuator can be achieved such that inversely related characteristics, specifically displacement and resonance frequency, can both be greatly improved.

In addition, by forming slits 208 in the elastic shim 203, residual air pockets at the adhesion surface can be eliminated for improving adhesion strength,, the drive force of the bimorph element is not dissipated by air bubbles, and both reliability and characteristics can be improved.

It is to be noted that the slits are formed in direction A (FIG. 4b) parallel to the length of the bimorph element in this embodiment, but the same effect is obtained when the slits are formed in a radial pattern.

In addition, while the second embodiment has been described as greatly improving both displacement and resonance frequency characteristics simultaneously, if the objective is to simply improve the displacement characteristic, it will be obvious that this can be achieved by providing the slits perpendicular to the length of the bimorph element, i.e., perpendicular to direction A.

Third Embodiment

The third embodiment of a head actuator according to the invention is described below with reference to FIGS. 5a and 5b.

Figure 5A:
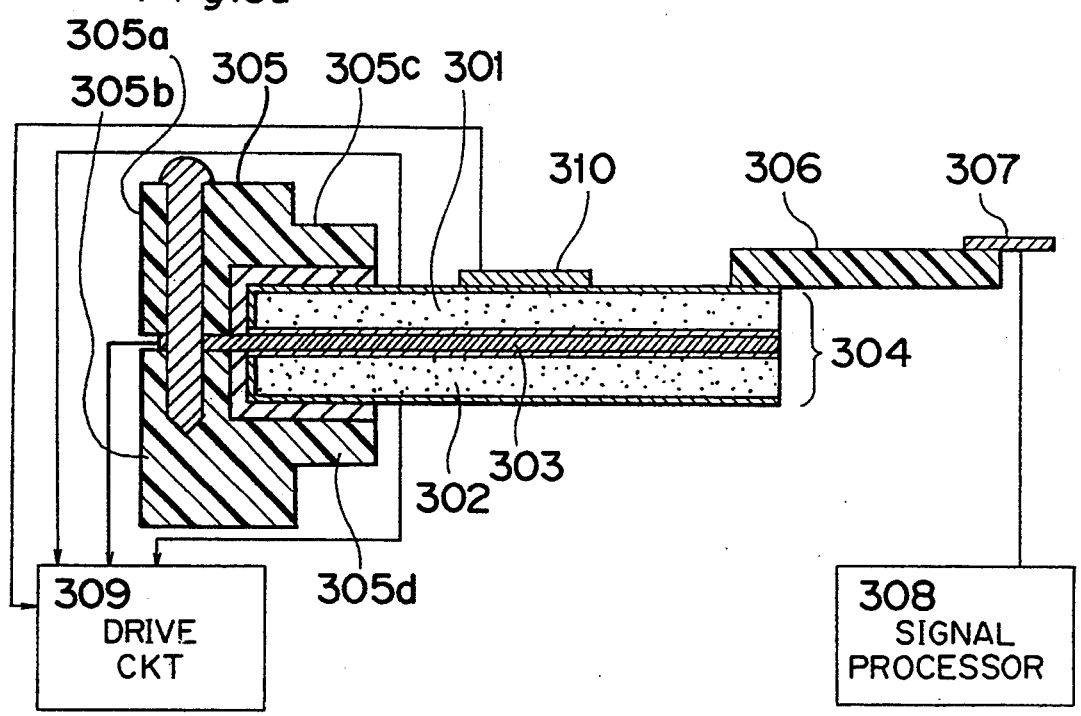
FIGS. 5a and 5b are diagrams for describing a head actuator according to the third embodiment of the present invention.
Figure 5B:
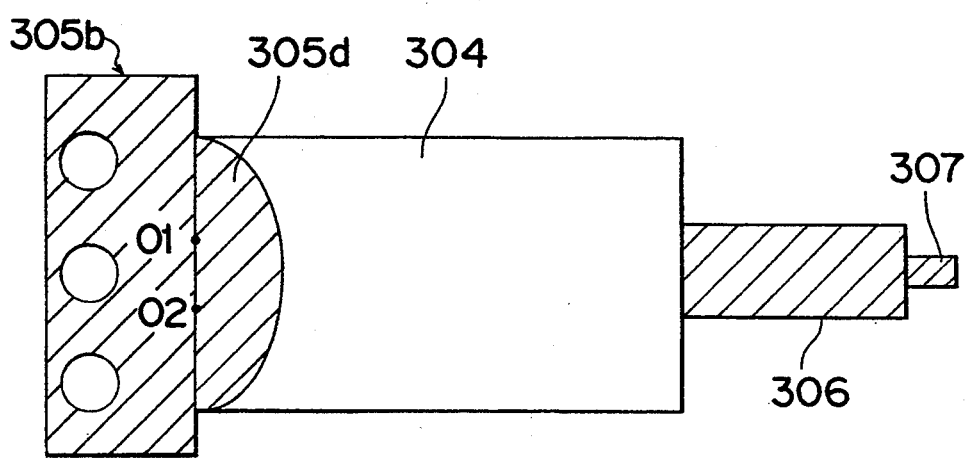

As shown in FIG. 5a, the head actuator apparatus comprises a bimorph element 304, which is formed by laminating a first piezoelectric body 301 to a second piezoelectric body 302 with an elastic shim 303 interposed therebetween, a base frame 305 to which the bimorph element 304 is fixed, a magnetic head support member 306 to which the magnetic head 307 is fixed, a signal processing circuit 308, drive circuit 309, and a magnetic head position detector 310.

According to the third embodiment, the upper and lower blocks 305a and 305b of the base frame 305 are provided with lip portions 305c and 305d, respectively, extending outwardly from the front face of the blocks. As shown in FIG. 5b, the lip portion 305d has a half ellipse configuration with its two focuses 01 and 02 located on the front face of the block.

The bimorph element 304 is formed by attaching the first and second piezoelectric bodies 301, 302 to opposite sides of the elastic shim 303 by means of adhesive. The elastic shim 303 is made of a material, such as phosphor bronze, elinvar, titanium or other metallic material, or a carbon fiber material. This bimorph element 304 is directly fastened to the base frame 305 at the curved member thereof.

In this embodiment bimorph element 304 is directly fastened to the base frame 305, but can be held in the base frame 305 in a manner similar to that described in the first embodiment as shown in FIG. 1. The magnetic head support member 306 is bonded with adhesive to the exposed surface of one of the piezoelectric bodies at the free end of the bimorph element 304, and the magnetic head 307 is fixed to the end of the magnetic head support member 306 to form the head actuator.

The operating principle of this head actuator is identical to that of the first and second embodiments described above.

Figure 6A:
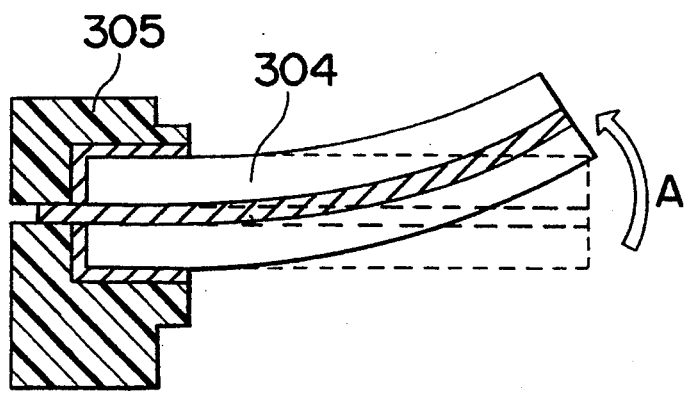
FIGS. 6a, 6b and 6c are diagrams showing the displacement of the bimorph element in the third embodiment.
Figure 6B:
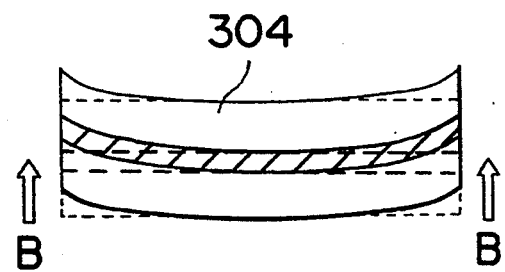
Figure 6C:
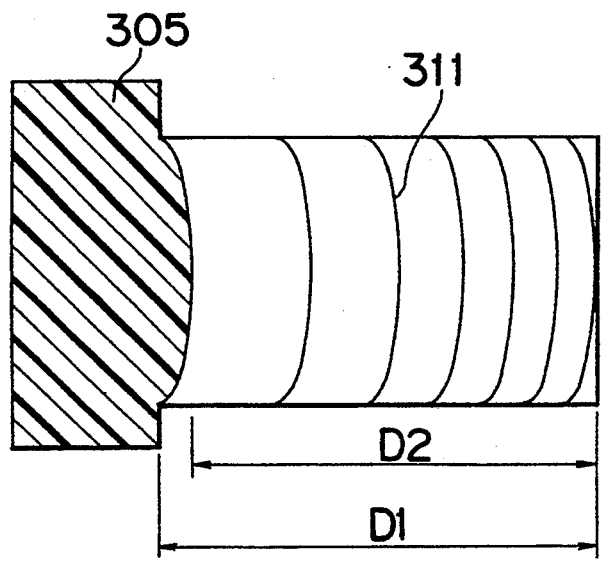

By the third embodiment, the overall bimorph element 304 deforms, in response to the applied voltage, in a manner similar to a human tongue such that the bimorph element 304 flexibly deforms when viewed from front (FIG. 6b) in direction B and when viewed from side (FIG. 6a) in direction A. The bimorph element 304 will deform in the opposite directions when opposite voltage is applied.

Thus, by supporting the bimorph element 304 on a base frame 305 with a curved edge conforming to this contour displacement distribution 311, the greatest length of the bimorph element is effective element length $D_1$, which is the same as when a straight-edged base frame is used, and bimorph element displacement is the same. The distance from the curved edge to the free end of the bimorph element is effective element length $D_2$, however, and a bimorph element with a high resonance frequency and equal displacement can thus be achieved.

In addition, twisting across the width of the bimorph element, which is caused by the bimorph element 304 being non-uniformly secured widthwise to the curved base frame, can be corrected by controlling the shape of bimorph element 304 deformation, and variations in the position of the magnetic head can thus be eliminated.

As described above, a high performance head actuator whereby a high resonance frequency is obtained without reducing displacement can be achieved by securing the bimorph element to a curved base frame.

It is to be noted that while the bimorph element 304 is supported by a curved base frame above, the shape of this curve shall not be limited to that shown and any other semi-elliptical curve can also be used. It is preferable, however, for the shape of this curve to correspond to the displacement distribution curve of the bimorph element.

Fourth-Seventh Embodiments

The fourth through seventh embodiments of the invention achieved by combining the above embodiments are described below.

The head actuator in the fourth embodiment is achieved by providing slits in the elastic shim of the head actuator of the first embodiment. Other physical characteristics of this embodiment are the same as those of the first embodiment.

By means of this configuration, the effects of the first and second embodiments are combined, obtaining a high performance head actuator featuring high reliability with further improvement in both displacement and resonance frequency characteristics.

The head actuator in the fifth embodiment is achieved by providing a curve to the base frame of the head actuator in the first embodiment. Other physical characteristics of this embodiment are the same as those of the first embodiment.

The head actuator of the sixth embodiment is identical to that of the fifth embodiment, but is characterized by providing a curve to the base frame of the head actuator in the second embodiment. Other physical characteristics of this embodiment are the same as those of the second embodiment.

The effects described in the first or second embodiments above are combined with those of the third embodiment in both the fifth and sixth embodiments, thus achieving high stability and reliability in the bimorph element and achieving a head actuator in which the inversely related characteristics of displacement and resonance frequency are both further improved.

The head actuator of the seventh embodiment adds slits to the elastic shim of the head actuator in the first embodiment, and provides a curve to the base frame. Other aspects of the construction are identical to those of the first embodiment.

The effects described in the first, second, and third embodiments above are combined by means of the seventh embodiment, thus achieving high stability and reliability in the bimorph element and achieving a head actuator in which the inversely related characteristics of displacement and resonance frequency are both further improved.

Eighth Embodiment

The eighth embodiment of a head actuator according to the invention is described below with reference to the cross section diagram thereof shown in FIG. 7.

Figure 7:
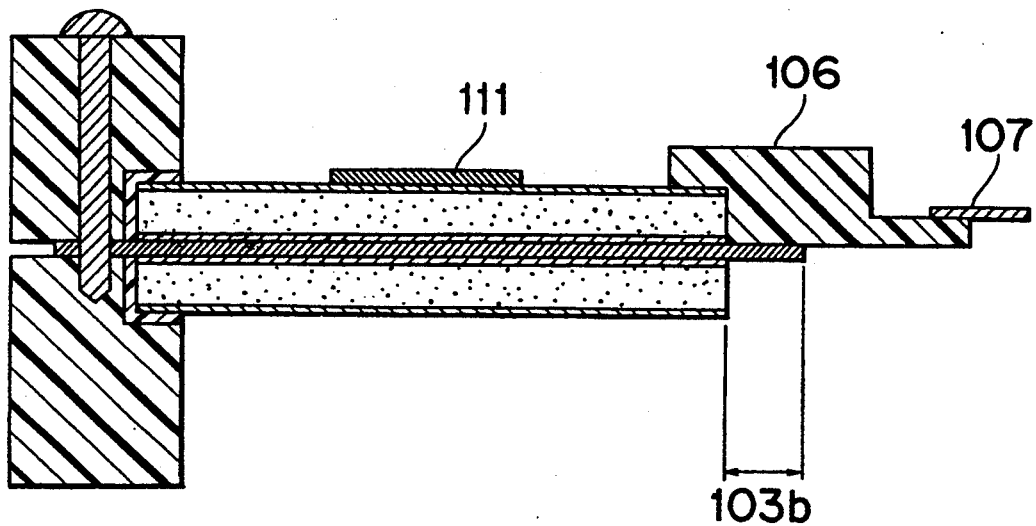
FIG. 7 is a cross sectional view of a head actuator according to the eighth embodiment of the present invention.

As shown in FIG. 7, the head actuator apparatus of the eighth embodiment is a modification of the head actuator described in the first embodiment by providing an extending portion 103b which is an extending portion of the elastic shim 103 at the free end, or front end, of the bimorph element 104 out beyond the first and second piezoelectric bodies 101, 102. The magnetic head support member 106 is bonded with adhesive to this extending portion 103b and the exposed surface of one of the piezoelectric bodies at the free end of the bimorph element 104, and the magnetic head 107 is fixed to the end of the magnetic head support member 106 to form the head actuator. Other aspects of the configuration of the eighth embodiment are identical to those of the first embodiment above.

In this configuration, however, it is necessary to keep the magnetic head support member 106 electrically insulated from the piezoelectric bodies and the elastic shim, and to reduce the load on the bimorph element 104. The magnetic head support member 106 is therefore made from a plastic or other insulation material with a low specific gravity. If a carbon fiber or other conductive material is used, however, it is still necessary to maintain electrical insulation by eliminating the electrodes from the adhesion surface of the piezoelectric bodies.

The same effects obtained with the first embodiment are also achieved by means of this eighth embodiment. Reliability with respect to repeated expansion and contraction in the adhesion area, which is caused by deformation when driving the bimorph element, is also improved by using an elastic shim 103 in which adhesion characteristics have been optimized and adhesion strength increased. These improved elastic shim 103 characteristics are achieved by increasing the adhesion area by bonding the magnetic head support member 106 to both the extending portion 103b of the elastic shim 103 and the piezoelectric body, thus compensating for unstable adhesion strength between the magnetic head support member 106 and the piezoelectric bodies of the bimorph element 104 in the first embodiment.

Changes in the head actuator length resulting from variations in the adhesion location when mounting the magnetic head support member 106 to the piezoelectric body can be minimized because the magnetic head support member 106 can be accurately positioned by the piezoelectric body and the extending portion 103b, thus simplifying adjustment of the magnetic head 107 installation.

Figure 8:
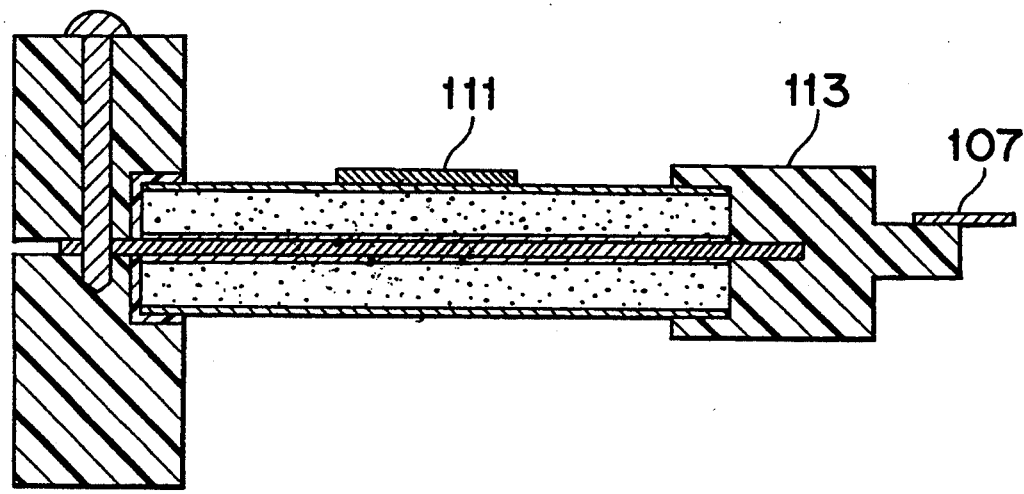
FIG. 8 is a cross sectional view of a head actuator showing an alternative configuration of the magnetic head support member.

It will be obvious that the magnetic head support member 113 where bonded to the piezoelectric bodies of the bimorph element can also be constructed as shown in FIG. 8. In addition, the position, of the magnetic head 107 and the shape of the magnetic head support member 113 where attached to the bimorph element shall not be limited to the above.

It will also be obvious that this eighth embodiment can also be adapted to the second through seventh embodiments above.

Ninth Embodiment

The ninth embodiment of a head actuator according to the invention is described below with reference to the cross section diagram thereof shown in FIG. 9.

Figure 9:
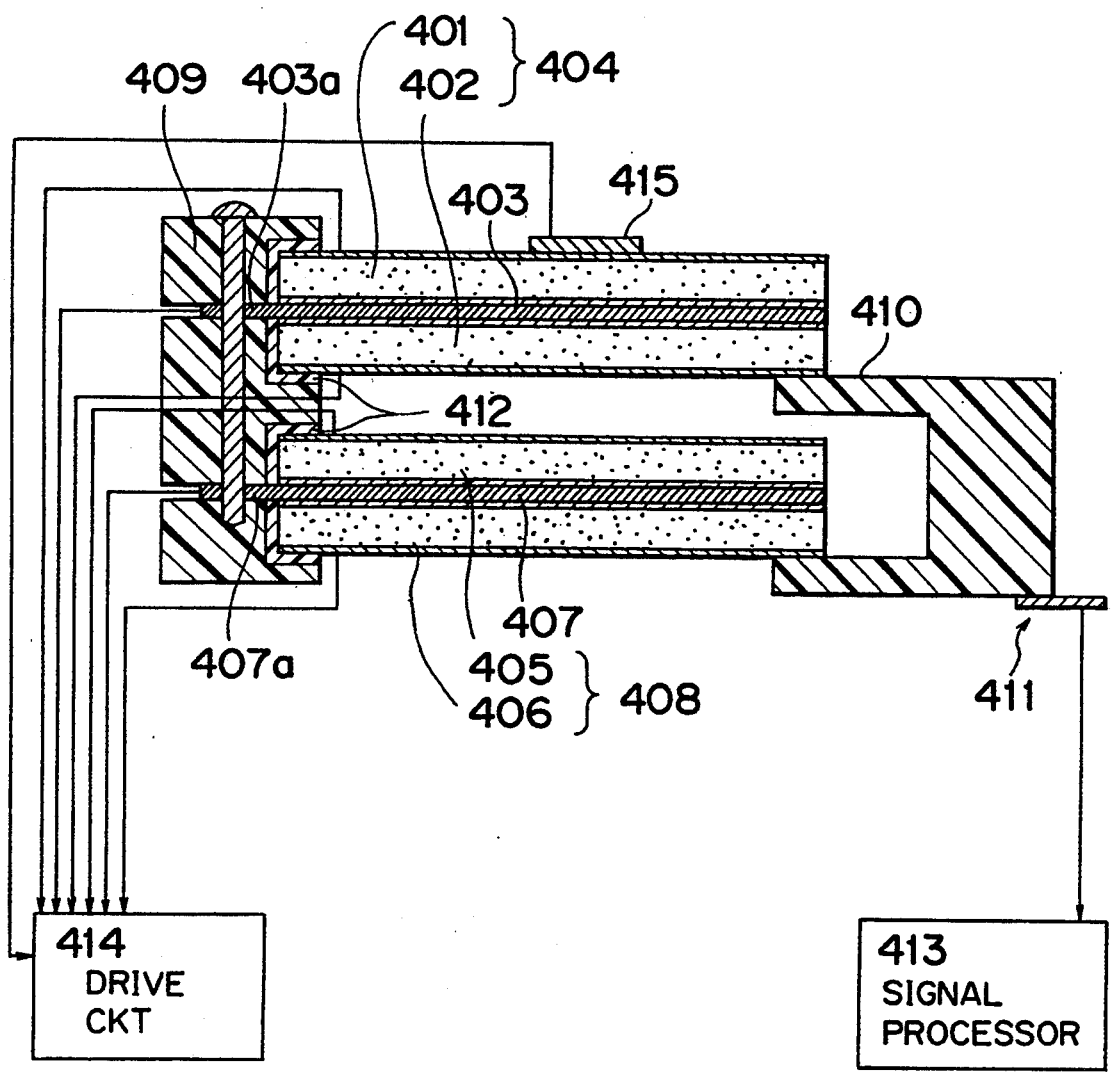
FIG. 9 is a cross sectional view of a head actuator according to the ninth embodiment of the present invention

As shown in FIG. 9, the ninth embodiment uses two bimorph elements, each bimorph element being similar to the one described above in the first embodiment. These bimorph elements are assembled parallel to each other with the free ends thereof connected by the magnetic head support member, on which the magnetic head is provided. Significant benefits unattainable with the first embodiment above can be achieved by the ninth embodiment.

Referring to FIG. 9, the head actuator apparatus comprises a first bimorph element 404, which is formed by laminating a first piezoelectric body 401 to a second piezoelectric body 402 with a first elastic shim 403 interposed therebetween, a second bimorph element 408, which is formed by laminating a third piezoelectric body 405 to a fourth piezoelectric body 406 with a second elastic shim 407 interposed therebetween, a base frame 409 to which the first and second bimorph elements are fixed, a magnetic head support member 410 connecting the first and second bimorph elements, a magnetic head 411, a flexible support member 412, a signal processing circuit 413, drive circuit 414, and a magnetic head position detector 415.

The first bimorph element 404 is formed by attaching the first and second piezoelectric bodies 401 and 402 to both sides of the first elastic shim 403 by adhesive, except at the inserted portion 403a thereof. Similarly, the second bimorph element 408 is formed by attaching the third and fourth piezoelectric bodies 405 and 406 to both sides of the second elastic shim 407 by adhesive, except at the inserted portion 407a thereof.

The elastic shims 403 and 407 are made of a material, such as phosphor bronze, elinvar, titanium or other metallic material, or a carbon fiber material, with a high elastic modulus in at least the deformation direction. A predetermined gap is provided between the inserted portions 403a and 407a of the first and second elastic shims 403 and 407 of first and second bimorph elements 404 and 408, respectively. The first and second elastic shims 403 and 407 are sandwiched in the base frame 409 and secured by a screw or other means so that the elastic shims are parallel to each other. The piezoelectric bodies and elastic shim are elastically supported and fastened using an epoxy adhesive or similar flexible support member 412 to the, inside of the base frame 409 at the free end side of the fixed end of the first and second elastic shims 403 and 407 of first and second bimorph elements 404 and 408 as shown in FIG. 9.

The free ends of the first and second bimorph elements 404 and 408 are connected parallel to each other by bonding the magnetic head support member 410 to one piezoelectric body of each bimorph element. The magnetic head 411 is mounted to the end of the magnetic head support member 410.

It is to be noted that while the flexible support members 412 in this embodiment are made with an epoxy adhesive, any material with a lower elastic modulus than the piezoelectric bodies, including hard rubber or plastic materials, can be alternatively used.

In addition, the position to which the magnetic head 411 is installed shall not be limited to that described hereinabove. The magnetic head 411 can be fixed to the top of the magnetic head support member 410, but is preferably located in line with the center of the first and second bimorph elements 404 and 408.

Figure 10A:
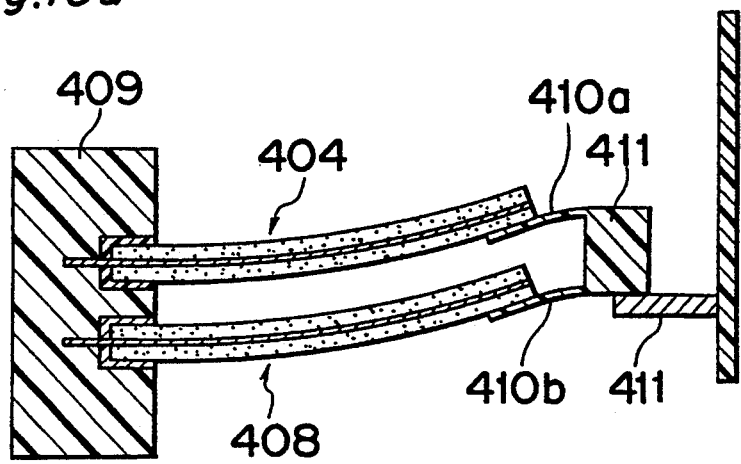
FIGS. 10a, 10b and 10c are diagrams for describing the operating principle of the ninth embodiment.
Figure 10B:
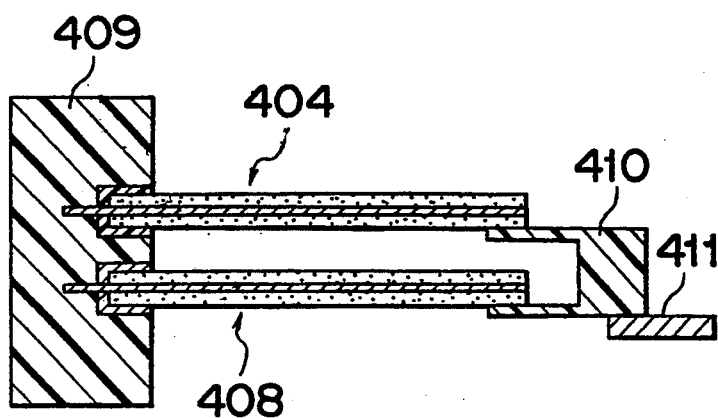
Figure 10C:
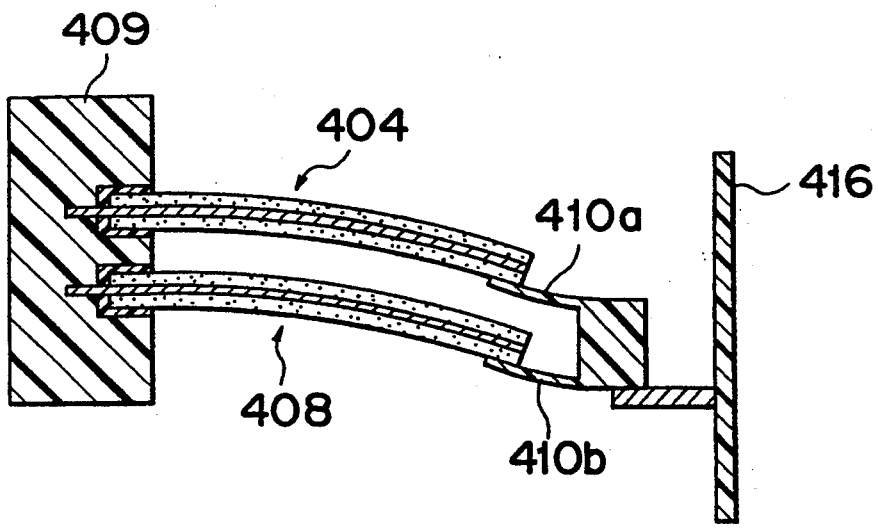

The operating principle of this head actuator is described next with reference to the illustrations in FIGS. 10a, 10b and 10c. The basic operating principle is the same as that described above with reference to FIGS. 2a, 2b and 2c, and only the new operation achieved with the ninth embodiment is described below.

The arms 410a and 410b of the magnetic head support member 410 provided to connect the free ends of the first and second bimorph elements 404 and 408 are curved in the same manner when the first and second bimorph elements are deformed. As a result, the magnetic head 411 travels parallel to the magnetic tape 416. As a result, the spacing angle between the magnetic head 411 and the magnetic tape 416 is approximately zero, and deterioration due to flux leakage of the recording and playback signals can be prevented.

By constructing the inserted portions of the bimorph elements according to this embodiment, the same effects obtained with the first embodiment are obtained. By additionally connecting two bimorph elements in parallel by means of the magnetic head support member, the spacing angle between the magnetic head and magnetic tape can is approximately zero. Deterioration of the recording and playback signals can thus be prevented, and a head actuator with higher performance and image quality can be achieved.

In addition, by holding the two bimorph elements parallel to each other, the inherent head weight and other static loads can be distributed. This minimizes the drop in the resonance frequency caused by the load mass, and achieves a head actuator with strong load resistance.

Tenth Embodiment

The tenth embodiment of a head actuator according to the invention is described below with reference to the cross section diagram thereof shown in FIG. 11.

Figure 11:
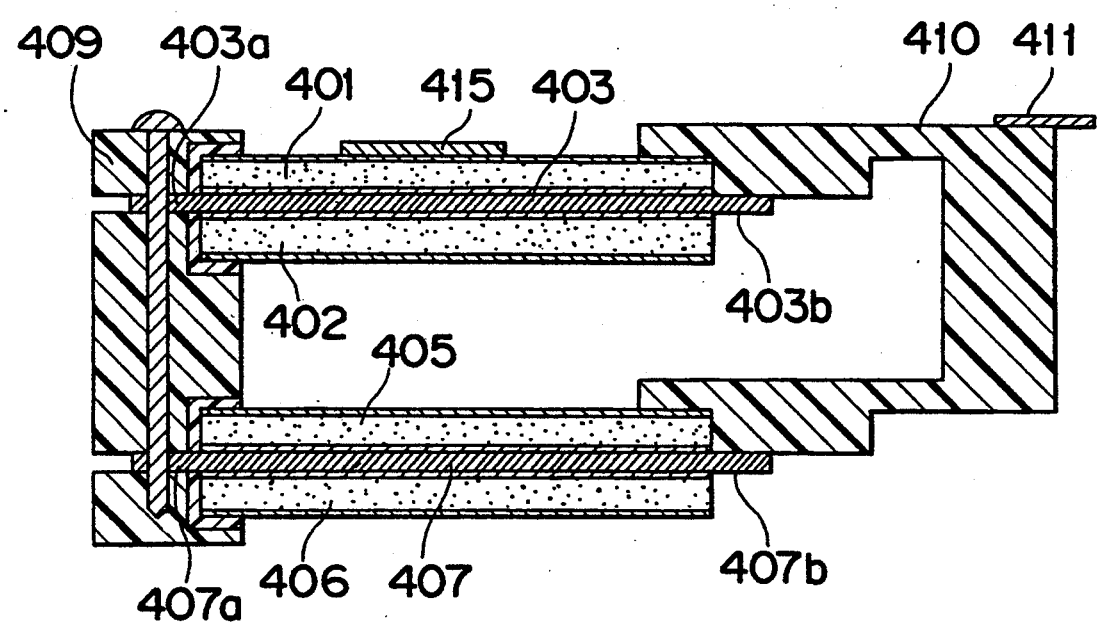
FIG. 11 is a cross sectional view of a head actuator according to the tenth embodiment of the present invention.

As shown in FIG. 11, the head actuator apparatus is a modification of the head actuator described in the ninth embodiment above by providing extending portions 403b and 407b on the free ends of the first and second bimorph elements 404 and 408, respectively, by extending the first and second elastic shims 403 and 407 out beyond the first and second and third and fourth piezoelectric bodies 401, 402, 405, 406. The magnetic head support member 106 is bonded with adhesive to the extending portions 403b, 407b and the exposed surface of one of the piezoelectric bodies at the free end of the first and second bimorph elements 404, 408. The magnetic head 411 is fixed to the end of the magnetic head support member 410 to form the head actuator. Other aspects of the configuration of this embodiment are identical to those of the ninth embodiment described above.

The same effects obtained with the ninth embodiment are also achieved by this tenth embodiment. Reliability with respect to repeated expansion and contraction in the adhesion area, which is caused by deformation when driving the bimorph elements, is also improved by using elastic shims in which adhesion characteristics have been optimized and adhesion strength increased. These improved elastic shim characteristics are achieved by increasing the adhesion area by bonding the magnetic head support member 410 to the extending portions 403b and 407b of both first and second elastic shims 403 and 407, respectively, and the piezoelectric bodies of the first and second bimorph elements 404 and 408, thus compensating for unstable adhesion strength between the magnetic head support member and the piezoelectric bodies of the first and second bimorph elements 404, 408 in the ninth embodiment.

Changes in the head actuator length resulting from variations in the adhesion location when mounting the magnetic head support member to the piezoelectric bodies can be minimized because the magnetic head support member can be accurately positioned by the piezoelectric bodies and the elastic shim extending portions, thus simplifying adjustment of the magnetic head installation.

In addition, by providing the magnetic head support member on the elastic shims near the plane of neutral deformation in the bimorph elements, differences in the deformation direction of the head actuator in the gap to the magnetic tape ("projection" below) during magnetic head tracking control can be eliminated and equalized, and the absolute value of this projection can be reduced. It is therefore possible to greatly improve the deterioration in the recording/playback signal resulting from the position of the magnetic head to the magnetic tape.

Figure 12:
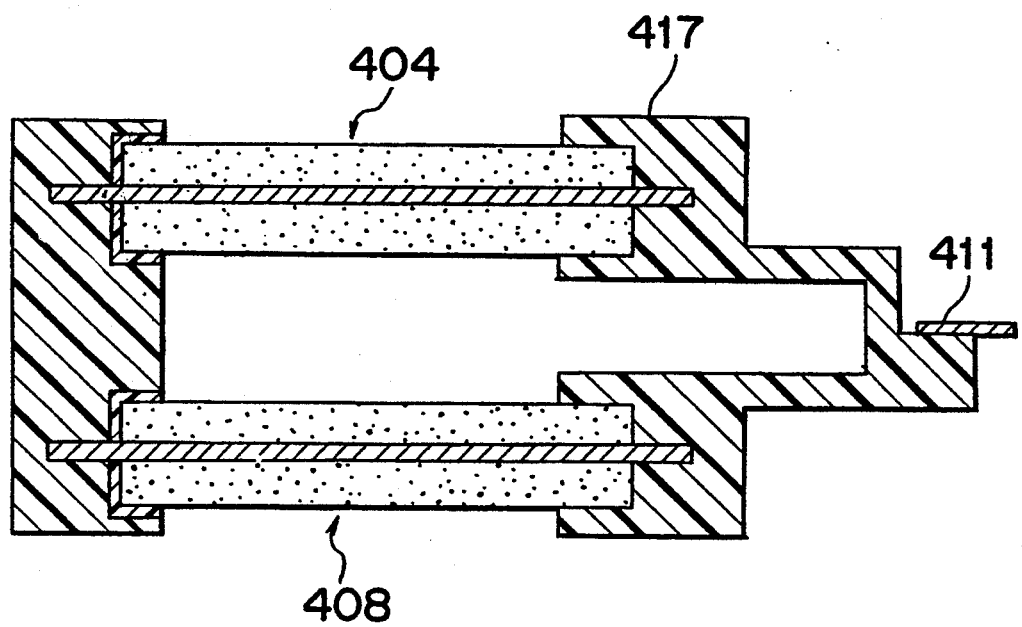
FIG. 12 is a cross sectional view of a head actuator showing an alternative configuration of the magnetic head support member.

It will be obvious that the magnetic head support member 417 bonded to the piezoelectric bodies of the bimorph elements can be constructed as shown in FIG. 12, so that the magnetic head 411 is located in line with the center of the first and second bimorph elements 404 and 408. In addition, the position of the magnetic head 411 and the shape of the magnetic head support member where attached to the bimorph elements shall not be limited to the above.

It is to be noted that the ninth and tenth embodiments above can also be adapted to the second through eight embodiments above, thereby enhancing the benefits achieved by the respective embodiments.

Figure 13A:
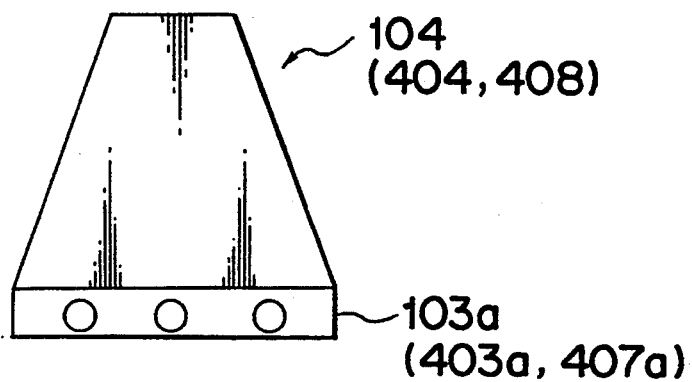
FIGS. 13a, 13b and 13c are top plan views showing alternative configurations of bimorph elements usable in the present invention.
Figure 13B:
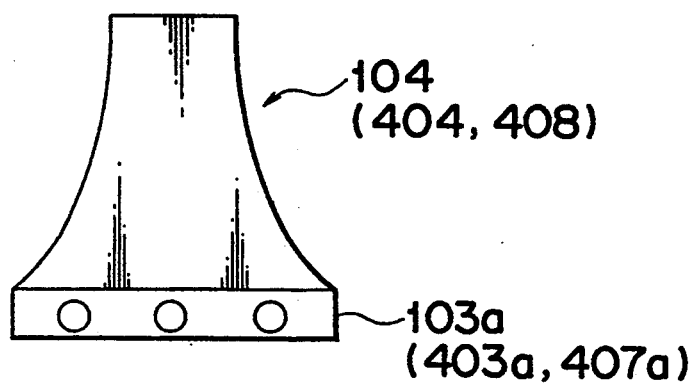
Figure 13C:
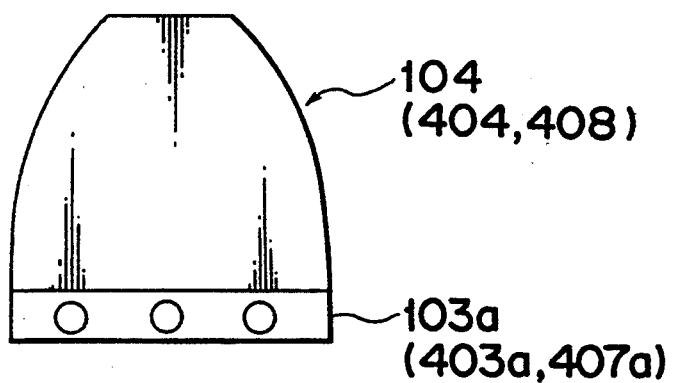
Figure 14A:
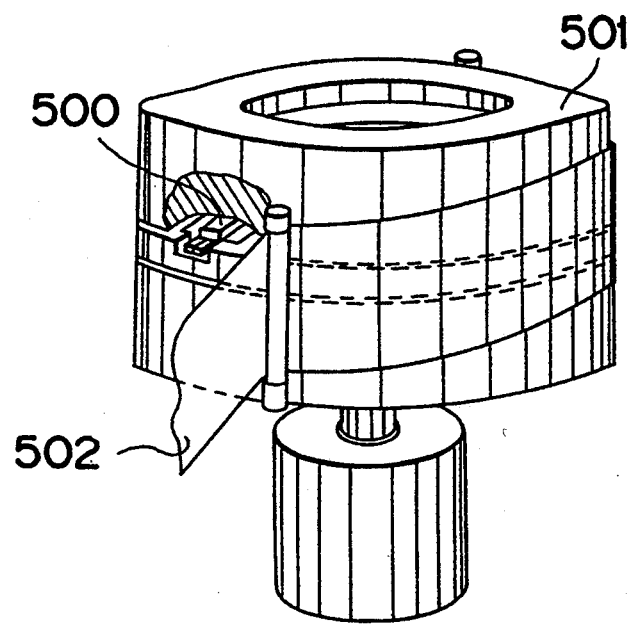
FIGS. 14a and 14b are a partially cut-away perspective view of the conventional magnetic head apparatus, and a diagram showing tracks recorded on a tape, respectively.
Figure 14B:
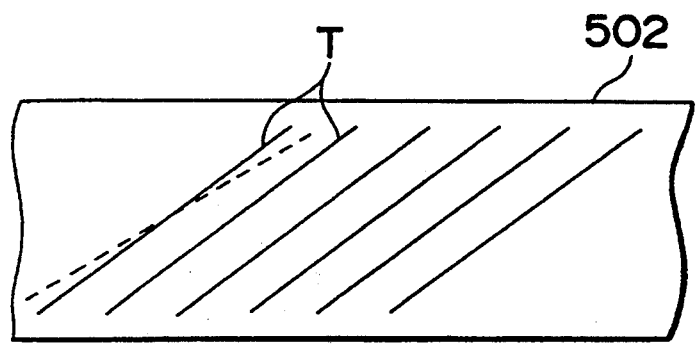
Figure 15:
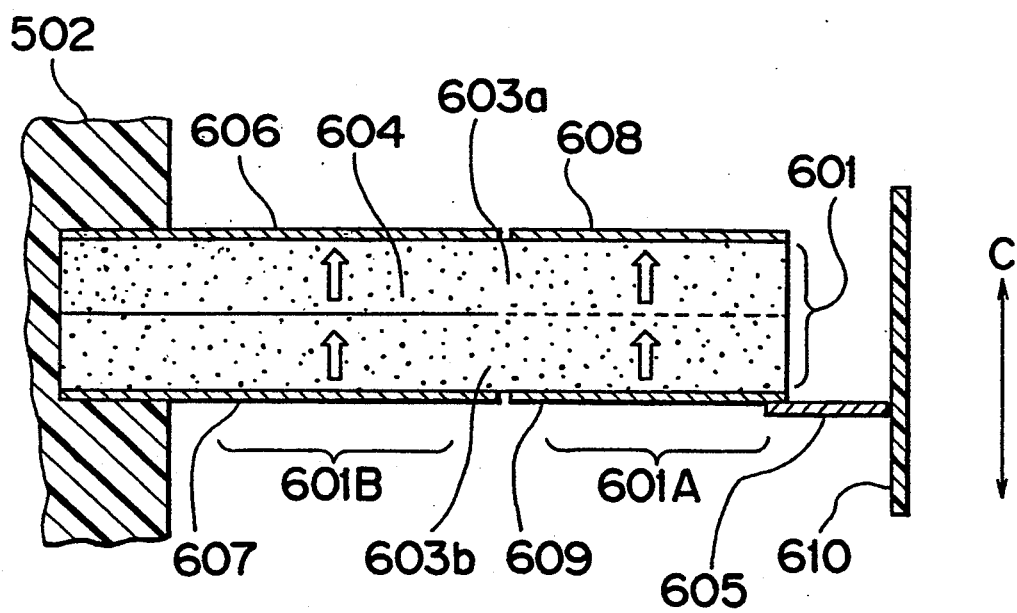
FIG. 15 is a cross sectional view of a conventional head actuator.
Figure 16:
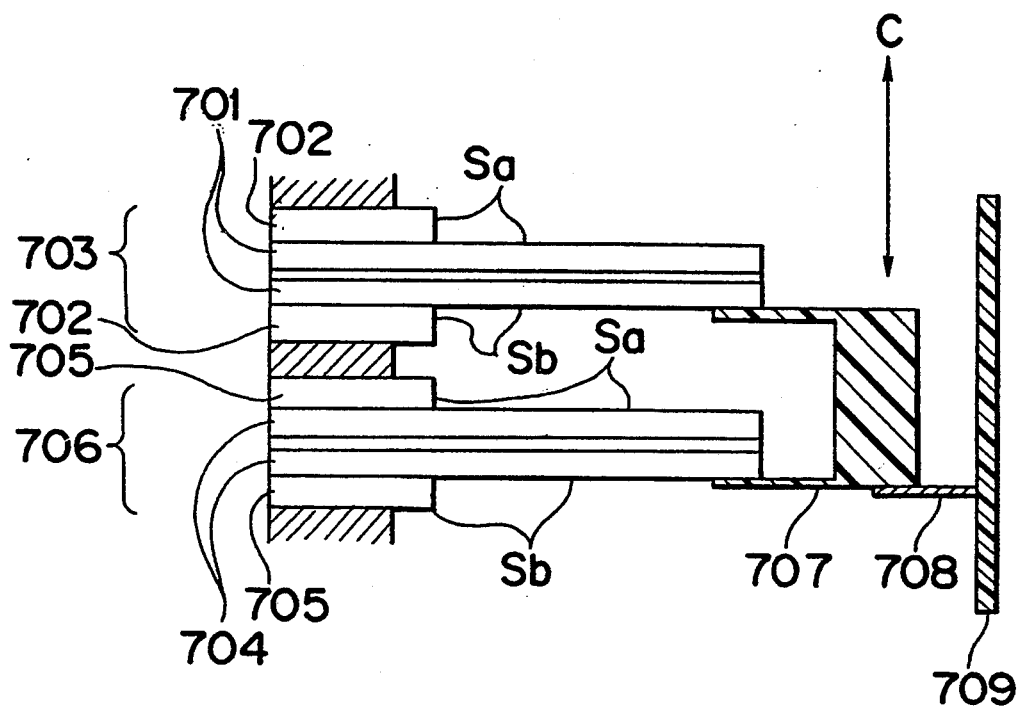
FIG. 16 is a cross sectional view of another conventional head actuator.

Furthermore, it will be obvious that bimorph element in which the width of the fixed end is greater than the width of the free end as shown by way of examples in FIGS. 13a, 13b and 13c can also be used for the bimorph element in the first through tenth embodiments above. In FIGS. 13a, 13b and 13c, circle holes are shown for receiving the screws. Using bimorph elements of this type further improves the resonance frequency characteristic by reducing the free end mass, and greatly increases the displacement because bending rigidity decreases closer to the free end, thus achieving a head actuator with even higher performance.

A high reliability, high positioning precision piezoelectric actuator and head actuator can be achieved by the present invention because the concentration of stress in the fixed end of the piezoelectric bodies at the base frame can be prevented when driving the bimorph elements by not directly fastening the piezoelectric bodies to the base frame, elastically supporting the piezoelectric bodies by means of a flexible support member, and firmly fastening the elastic shims to the base frame. Because the elastic shims are firmly secured, deformation unrelated to piezoelectric body strain can also be prevented.

In addition, a high reliability, high performance head actuator featuring good tracking response, variable speed, noiseless playback over a wide tape speed range, and improved displacement and resonance frequency, characteristics which are generally inversely related, can be achieved by providing a construction in which the effective element length can be increased during DC operation and the effective element length with respect to the resonance frequency is the distance from the fixed end of the flexible support to the free end by providing a flexible support member at the fixed part of the bimorph elements; by providing a construction in which the resonance frequency can be improved by effectively reducing the total mass without reducing the elastic modulus by providing slits in the elastic shim; or by providing a construction in which the effective element length with respect to displacement can be increased and the effective element length with respect to resonance frequency can be decreased by providing a curve in the base frame.

The invention being thus described, it will be obvious that the same may be varied ill many ways. Such variations are not to be regarded as a departure from the spirit and scope of the invention, and all such modifications as would be obvious to one skilled in the art are intended to be included within the scope of the following claims.

What is claimed is:

1. A piezoelectric actuator comprising:
a bimorph element comprising first and second piezoelectric bodies each polarized in a thickness direction, and an elastic shim sandwiched between said first and second piezoelectric bodies, said shim having a length longer than said first and second piezoelectric bodies so that a first end portion extends outwardly from said first and second piezoelectric bodies, and electrodes deposited on surfaces of said piezoelectric bodies remote from the respective surfaces facing said shim, said bimorph element having a first end portion from which said first end portion of said shim extends and a second end portion remote from said first end portion;

a base frame having a recess and a groove at the bottom of said recess for receiving said first end portion of said bimorph element and said first end portion of said shim, respectively, said recess having a size slightly greater than the size of said first end portion of said bimorph element; and an elastic support member applied in a space between said recess and said first end portion of said bimorph element.

2. A piezoelectric actuator according to claim 1, wherein said shim is formed with a plurality of slits.

3. A piezoelectric actuator according to claim 1, wherein said base frame has first and second lip portions each having a half ellipse configuration and extending outwardly from said base frame for holding said bimorph element between said first and second lip portions.

4. A piezoelectric actuator according to claim 2, wherein said base frame has first and second lip portions each having a half ellipse configuration and extending outwardly from said base frame for holding said bimorph element between said first and second lip portions.

5. A piezoelectric actuator according to claim 1, wherein said first end portion of said bimorph element is wider than said second end portion of said bimorph element.

6. A piezoelectric actuator according to claim 1, further comprising a driving circuit for driving said bimorph element.

7. A piezoelectric head actuator comprising:
a bimorph element comprising first and second piezoelectric bodies each polarized in a thickness direction, and an elastic shim sandwiched between said first and second piezoelectric bodies, said shim having a length longer than said first and second piezoelectric bodies so that a first end portion extends outwardly from said first and second piezoelectric bodies, and electrodes deposited on surfaces of said piezoelectric bodies remote from the respective surfaces facing said shim, said bimorph element having a first end portion from which said first end portion of said shim extends and a second end portion remote from said first end portion;

a base frame having a recess and a groove at the bottom of said recess for receiving said first end portion of said bimorph element and said first end portion of said shim, respectively, said recess having a size slightly greater than the size of said first end portion of said bimorph element;

an elastic support member applied in a space between said recess and said first end portion of said bimorph element;

a magnetic head support member connected to second end portion of said bimorph element; and a magnetic head connected to said magnetic head support member.

8. A piezoelectric head actuator according to claim 7, wherein said shim is formed with a plurality of slits.

9. A piezoelectric head actuator according to claim 7, wherein said base frame has first and second lip portions each having a half ellipse configuration and extending outwardly from said base frame for holding said bimorph element between said first and second lip portions.

10. A piezoelectric head actuator according to claim 8, wherein said base frame has first and second lip portions each having a half ellipse configuration and extending outwardly from said base frame for holding said bimorph element between said first and second lip portions.

11. A piezoelectric head actuator according to claim 7, wherein said shim comprises a second end portion extending outwardly from said first and second piezoelectric bodies so that said magnetic head support member is seated on said second end portion of said shim.

12. A piezoelectric head actuator according to claim 7, wherein said first end portion of said bimorph element is wider than said second end portion of said bimorph element.

13. A piezoelectric head actuator according to claim 7, further comprising a driving circuit for driving said bimorph element.

14. A piezoelectric head actuator according to claim 7, further comprising a signal processing circuit connected to said magnetic head.

15. A piezoelectric head actuator, comprising:
a first bimorph element comprising first and second piezoelectric bodies each polarized in a thickness direction, and a first elastic shim sandwiched between said first and second piezoelectric bodies, said first elastic shim having a length longer than said first and second piezoelectric bodies so that a first end portion extends outwardly from said first and second piezoelectric bodies, and electrodes deposited on surfaces of said piezoelectric bodies remote from the respective surfaces facing said first elastic shim, said first bimorph element having a first end portion from which said first end portion of said first elastic shim extends and a second end portion remote from said first end portion;

a second bimorph element comprising third and fourth piezoelectric bodies each polarized in a thickness direction, and a second elastic shim sandwiched between said third and fourth piezoelectric bodies, said second elastic shim having a length longer than said third and fourth piezoelectric bodies so that a first end portion extends outwardly from said third and fourth piezoelectric bodies, and electrodes deposited on surfaces of said piezoelectric bodies remote from the respective surfaces facing said second elastic shim, said second bimorph element having a first end portion from which said first end portion of said second elastic shim extends and a second end portion remote from said first end portion;

a base frame having first and second recesses and grooves at the bottom of said recesses, respectively, said first recess and said first groove receiving said first end portions of said first bimorph element and said first end portion of said first elastic shim, respectively, and said second recess and said second groove receiving said first end portions of said second bimorph element and said first end portion of said second elastic shim, respectively, each of said recesses having a size slightly greater than the size of said first end portion of said respective bimorph element;

a first elastic support member applied in a space between said first recess and said first end portion of said first bimorph element;

a second elastic support member applied in a space between said second recess and said first end portion of said second bimorph element;

a magnetic head support member connected to said second end portions of said first and second bimorph elements; and a magnetic head connected to said magnetic head support member.

16. A piezoelectric head actuator according to claim 15, wherein each of said first and second shims is formed with a plurality of slits.

17. A piezoelectric head actuator according to claim 15, wherein said base frame comprises first and second lip portions for each said recess each said lip portion having a half ellipse configuration and extending outwardly from said base frame, wherein said first and second lip portions hold said first and second bimorph elements, respectively.

18. A piezoelectric head actuator according to claim 16, wherein said base frame comprises first and second lip portions for each said recess each said lip portion having a half ellipse configuration and extending outwardly from said base frame, wherein said first and second lip portions hold said first and second bimorph elements, respectively.

19. A piezoelectric head actuator according to claim 15, wherein said first shim has a second end portion extending outwardly from said first and second piezoelectric bodies and said second shim has a second end portion extending outwardly from said third and fourth piezoelectric bodies, so that said magnetic head support member is seated on said second end portions.

20. A piezoelectric head actuator according to claim 15, wherein said first end portion of at least one of said first and second bimorph elements wider than said second end portion of said at least one of said first and second bimorph elements.

21. A piezoelectric head actuator according to claim 15, further comprising a driving circuit for driving said first and second bimorph elements.

22. A piezoelectric head actuator according to claim 15, further comprising a signal processing circuit connected to said magnetic head.

* * * * *

UNITED STATES PATENT AND TRADEMARK OFFICE
CERTIFICATE OF CORRECTION

PATENT NO. : 5,408,376
DATED : April 18, 1995
INVENTOR(S) : T. NISHIKURA et al.

It is certified that error appears in the above-indentified patent and that said Letters Patent is hereby corrected as shown below:

At column 8, line 11, change "ill" to ---in---.

At column 8, line 42, change "strength,," to ---strength,---.

At column 11, line 36, change "position," to ---position---.

At column 12, line 24, change "the," to ---the---.

At column 14, line 57, change "ill" to ---in---.

At column 15, lines 63 and 64 (claim 7, lines 24 and 25), change "to second" to ---to said second---.

At column 18, line 16 (claim 20, line 3), change "wider than" to ---is wider than---.

Signed and Sealed this

Twenty-fourth Day of December, 1996

Attest:

BRUCE LEHMAN

*Attesting Officer*          *Commissioner of Patents and Trademarks*